(12) United States Patent
Guzik

(10) Patent No.: US 9,627,602 B1
(45) Date of Patent: Apr. 18, 2017

(54) DRIVING CIRCUIT FOR A PIEZOELECTRIC ACTUATOR

(71) Applicant: Guzik Technical Enterprises, Mountain View, CA (US)

(72) Inventor: Nahum Guzik, Palo Alto, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 15/188,327

(22) Filed: Jun. 21, 2016

(51) Int. Cl.
*H01L 41/04* (2006.01)
*H02N 2/02* (2006.01)
*G11B 5/48* (2006.01)

(52) U.S. Cl.
CPC ............ *H01L 41/042* (2013.01); *G11B 5/483* (2015.09)

(58) Field of Classification Search
CPC ............................... H01L 41/042; G11B 5/483
USPC .......................................................... 360/294
See application file for complete search history.

(56) References Cited

U.S. PATENT DOCUMENTS

| 4,253,567 | A | | 3/1981 | Goldammer |
| 4,263,527 | A | | 4/1981 | Comstock |
| 4,460,842 | A | | 7/1984 | Waanders et al. |
| 5,208,506 | A | | 5/1993 | Yamashita |
| 5,220,836 | A | * | 6/1993 | Harms ...................... G01L 1/16 310/338 |
| 6,246,152 | B1 | | 6/2001 | Fontanella et al. |
| 6,504,669 | B1 | * | 1/2003 | Janz ..................... G11B 5/5552 360/78.05 |
| 6,624,708 | B1 | * | 9/2003 | Wessendorf ............. H03B 5/36 331/116 R |

* cited by examiner

*Primary Examiner* — J. San Martin
(74) *Attorney, Agent, or Firm* — Burns & Levinson LLP; Joseph M. Maraia

(57) ABSTRACT

A driving circuit is configured to apply a drive signal to a first terminal of a drive piezoelectric actuator having a second terminal coupled to ground. In response, the drive piezoelectric actuator controls the position of a head in a head gimbal assembly. A reference piezoelectric actuator, characterized by dimensional and electro-mechanical properties substantially matching those of the drive piezoelectric actuator, is included in the driving circuit. The driving circuit controls the reference piezoelectric actuator so that a voltage is produced across the terminals of the reference piezoelectric actuator, wherein that voltage is proportional to the charge stored in the reference piezoelectric element. That voltage is transmitted through a buffer amplifier to the drive piezoelectric actuator where it creates in it a charge equal to the charge in the reference piezoelectric actuator. In response, the drive piezoelectric actuator moves the read/write head, performing the desired positioning according to the control signal.

13 Claims, 4 Drawing Sheets

DRIVING CIRCUIT FOR A PIEZOELECTRIC ACTUATOR

FIELD OF THE TECHNOLOGY

The present technology relates to piezoelectric actuators and, in particular, to piezoelectric actuators used in disk storage devices and in head/disk test equipment.

BACKGROUND OF THE TECHNOLOGY

A hard disk drive is known as a type of information storage device. A hard disk drive typically includes one or more magnetic disks rotatably mounted in association with a spindle and one or more actuator assemblies for positioning a magnetic transducer, or head, relative to concentric circular data tracks on a magnetic medium-bearing surface of each disk.

The recording densities of hard disk drives have been increasing with advances in personal computers, so that data tracks are becoming increasingly more densely positioned on the disks, and the tracks themselves are becoming physically narrower. As a result, maintaining the transducer or head in an accurate track-following position for purposes of reading and writing, is becoming more difficult. To accommodate the needed increasingly finer adjustments in the position of the magnetic head, a precision positioning actuator has been introduced. For such an actuator, a single piezoelectric actuator assembly is generally employed. The piezoelectric actuator forms a part of a head gimbal assembly which moves the head transverse to a track to provide fine radial positioning of a head in reference to a track.

In such configurations in the prior art, each piezoelectric actuator typically includes a piezoelectric crystal extending along a drive axis, and disposed between parallel electrically conductive plates extending transverse to the drive axis. Each piezoelectric actuator is responsive to an applied voltage control signal applied across its plates to effect a desired physical displacement of one of its plates with respect to the other. One difficulty that arises in the use of piezoelectric actuators is a hysteresis effect. Due to the hysteresis effect, a curve that describes the displacement response of a piezoelectric element to applied voltage, tends to form a loop rather than straight line. As a result, the relative displacement of its plates is not precisely linear with voltage, and, moreover, is not a single-valued function of the applied voltage.

In addition, because of the hysteresis, the steepness of the displacement dependence on the control voltage varies when the control voltage is changed. As a result, when deployed in a control feedback loop, the loop gain depends on control voltage changes, with a consequent decline of the bandwidth of the feedback loop. That decline is another reason for deterioration of the write/read head positioning precision in the prior art.

The problem of hysteresis may be overcome if the displacement of a piezoelectric actuator is controlled through an electric input control signal by applying to the actuator, an electric charge proportional to the input signal, rather than by applying a corresponding voltage or current. Such a way to improve the piezoelectric actuator performance is possible since the hysteresis loop of a charge-deformation characteristic curve is generally much smaller than that of a voltage-deformation characteristic curve for a piezoelectric crystal structure.

A prior art driving circuit that provides control of a piezoelectric actuator in a charge mode, was proposed in U.S. Pat. No. 4,263,527, entitled "Charge Control of Piezoelectric Actuators to Reduce Hysteresis Effects", issued to Robert H. Comstock. A block diagram of the circuit disclosed in that patent is shown in FIG. 1. The block diagram comprises a piezoelectric actuator 13 having a first terminal 13A and a second terminal 13B, a fixed value capacitor 15, having electrodes 15A and 15B connected in series between the second terminal 13B of actuator 13 and ground, an operational amplifier 11 having a non-inverting input terminal 10, an inverting input terminal 12, and an output terminal 11A, where the non-inverting input terminal 10 is adapted to receive an input control signal, and where the output terminal 11A of operational amplifier 11 is coupled to the first terminal 13A of actuator 13. A buffer amplifier 14 includes an input terminal 14A coupled to the second terminal 13B of actuator 13 and an output terminal 14B coupled to the inverting input terminal 12 of operational amplifier 11. Upon application of an input control signal to non-inverting input terminal 10 of operational amplifier 11, the voltage at output terminal 11A of amplifier 11 induces opposite charges on opposite surfaces of a piezoelectric element incorporated in the piezoelectric actuator 13, where those opposite surfaces are coupled to a respective one of the first terminal 13A and second terminal 13B of actuator 13. In the series connection of the piezoelectric actuator 13 and capacitor 15, since buffer amplifier 14 is characterized by high input impedance, the same current (corresponding to the charge transfer occurring at the surfaces of the piezoelectric element of actuator 13) flows through both elements. For this reason, the current induces an equal charge differential between the electrodes 15A and 15B of the capacitor 15, thereby producing a voltage proportional to the charge on the actuator 13 between the upper terminal 15A of the capacitor and the lower electrode 15B, coupled to ground. This voltage is fed back through buffer amplifier 14 to the inverting terminal 12 of operational amplifier 11. When the input voltage changes, the output of the amplifier 11 is changed, and the charge on actuator 13 is changed too. The feedback arrangement thereby quickly forces the charge on the actuator 13 to a value proportional to the input control signal 10.

The impact of hysteresis on the precision of piezoelectric actuator operation is essentially eliminated in the driving circuit of the FIG. 1. However, the suggested solution suffers from some drawbacks that prevent its use as such in a hard disk drive and in head and disk test equipment.

More particularly, in most cases, one plate of the piezoelectric actuator incorporated in a head gimbal assembly is connected to a reference terminal, such as ground. For this reason, it is not possible to insert a capacitor between the piezoelectric actuator and the ground, as suggested in U.S. Pat. No. 4,253,567.

In practice, a head gimbal assembly, has only one wire that connects it with the control unit of the disk drive (or head/disk test equipment) and which may be used for control of the piezoelectric actuator-driven displacement of a head. However, the prior art driving circuit of FIG. 1 requires two couplings: one from the amplifier 11 to the piezoelectric actuator 13 and one from the capacitor 15 to the buffer (feedback) amplifier 14.

The circuit between the capacitor 15 and feedback amplifier 14 has high impedance loads at both of its ends. Such a circuit is susceptible to the noise and electromagnetic interference (EMI) from the environment, which is one of the primary sources of the interference that decreases the accuracy of the operation of a piezoelectric actuator.

An improved prior art driving circuit for controlling a piezoelectric actuator that can be used in a disk drive, was proposed in U.S. Pat. No. 6,246,152, entitled "Driver Circuit for Controlling a Piezoelectric Actuator in Charge Mode", issued to Luca Fontanella et al.

A block diagram that illustrates the operation of the driving circuit described in the '152 patent is shown in FIG. 2 herein. In that figure, a control signal is applied to a non-inverting terminal 20 of a differential input stage 21. The output of differential input stage 21 is connected through a main amplifier 26 to a piezoelectric actuator 23, and through an auxiliary amplifier 24 to an inverting terminal 22 of differential input stage 21. The inverting terminal 22 of differential input stage 21 is coupled to ground by a capacitor 25.

Due to feedback loop operation, a voltage across capacitor 25 only slightly, or not at all, differs from the input control signal at terminal 20. Charge stored in the capacitor 25 is proportional to the voltage between its terminals, and hence it is proportional to the input control signal 20.

In the illustrated configuration of the '152 patent, the main amplifier 26 is identical to the auxiliary amplifier 24. Since the inputs of the amplifiers 26 and 24 are connected in parallel, the current produced by main amplifier 26 is equal to head gimbal assembly drive current at the output of auxiliary amplifier 24. As a result, charge stored between terminals of the piezoelectric actuator 23 equals the charge stored on capacitor 25, and is proportional to the input control signal. The fact that the piezoelectric actuator 23 in the '152 patent's configuration shown in the block diagram of FIG. 2 herein, is driven by charge instead of voltage, provides a desired suppression of hysteresis effect in actuator operative characteristics.

However, it is important to note that in the '152 patent's configuration shown in FIG. 2 herein, the charge storage capacitor 25 is not directly coupled to the piezoelectric actuator, as was the case in the configuration of FIG. 1. That allows capacitor 25 to be located in a driving circuit away from the immediate vicinity of the piezoelectric actuator 23, avoiding one of the above-noted disadvantages of the configurations of U.S. Pat. No. 4,263,527. With the driving circuit located away from piezoelectric actuator (and the read/write head), that allows a reduction in the number of wires between the driving circuit and the piezoelectric actuator 23 down to one. The piezoelectric actuator 23 in the block diagram of FIG. 2 herein is connected by one of its terminals to ground. Thereby as a result, piezoelectric actuators can be employed with one grounded terminal (as usually is the case in hard disk drives). However, there still remains a significant problem: noise immunity of the driving circuit of configurations of the prior art type of FIG. 2 herein is poor as also is the case in configurations of the prior art type of FIG. 1 herein.

In configurations of the type of FIG. 2, the amplifiers 24, 26 should produce current proportional to the input voltage; that is, those amplifiers are to operate as current sources. For this reason, the output impedance of those amplifiers is high. The circuit 27 in FIG. 2 herein connects the piezoelectric actuator 23 to the main amplifier 26 (located in a driving circuit at a distance from the piezoelectric actuator 23). This circuit is loaded at one end by high ohmic impedance of the amplifier 26 output, and at the other end, by a high ohmic impedance of the piezoelectric actuator 23. As a result, this circuit is compromised in large extent to induced noise and EMI present in the equipment. The induced noise is generally transmitted to the piezoelectric actuator 23, giving rise to random variations of produced displacements and deterioration of the read/write head positioning accuracy.

SUMMARY OF THE TECHNOLOGY

In a form of the present technology, a driving circuit is configured to apply a drive signal to a first terminal of an "operative" (hereinafter "drive") piezoelectric actuator having a second terminal coupled to ground, providing a "single wire" drive arrangement. The drive piezoelectric actuator is responsive to the control signal to control the position of a head in a head gimbal assembly. With the single wire configuration, the driving circuit can be remote from the drive piezoelectric actuator. A reference piezoelectric actuator, characterized by dimensional and electro-mechanical properties substantially matching those of the drive piezoelectric actuator, is incorporated in the driving circuit. The driving circuit exerts control over the reference piezoelectric actuator. In the course of the operation of the driving circuit, a voltage is produced across the terminals of the reference piezoelectric actuator, wherein that voltage is proportional to the charge stored in the reference piezoelectric element. That voltage is transmitted through a buffer amplifier to the drive piezoelectric actuator, where it creates in it a charge equal to the charge in the reference piezoelectric actuator. In response, the drive piezoelectric actuator moves the read/write head, performing the desired positioning according to the control signal. The single wire connection to the operative piezoelectric actuator is sufficient to transmit the voltage from the reference piezoelectric actuator to the drive terminal of the ground-connected operative piezoelectric actuator. The buffer amplifier that transmits the voltage from the reference piezoelectric actuator to the drive piezoelectric actuator, is configured as a voltage source, and is characterized by low ohmic output impedance. The resultant low ohmic load at one end of the circuit, connecting the reference piezoelectric actuator with the drive piezoelectric actuator, makes this circuit substantially invulnerable to induced noise and provides high accuracy of read/write head positioning.

DETAILED DESCRIPTION

Figure 1:
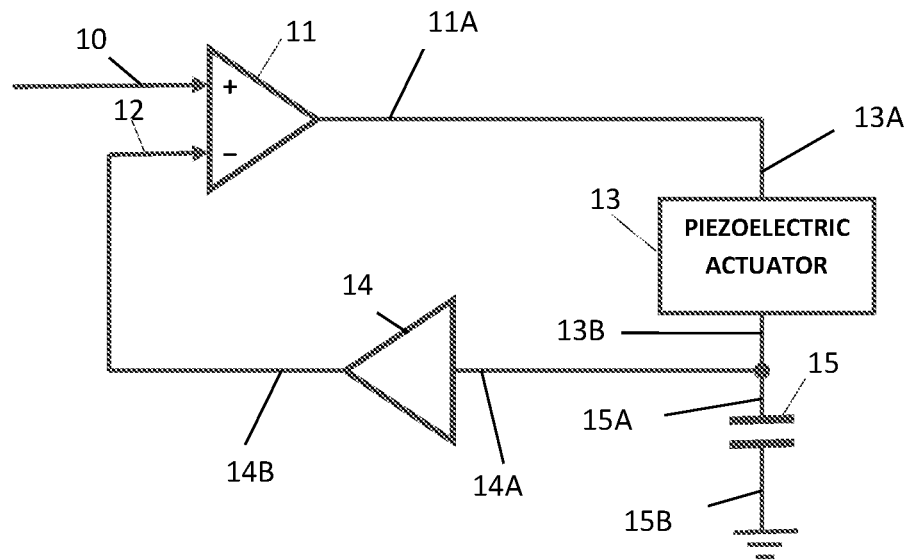
FIG. 1 shows a prior art driving circuit for a piezoelectric actuator with control in a charge mode.
Figure 2:
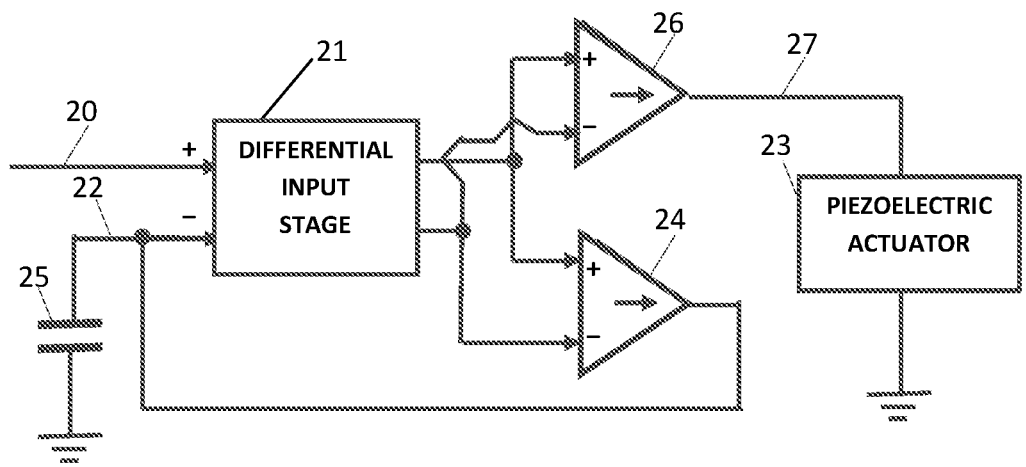
FIG. 2 shows a prior art modified driving circuit for a piezoelectric actuator suitable for use in hard disk drive.
Figure 3:
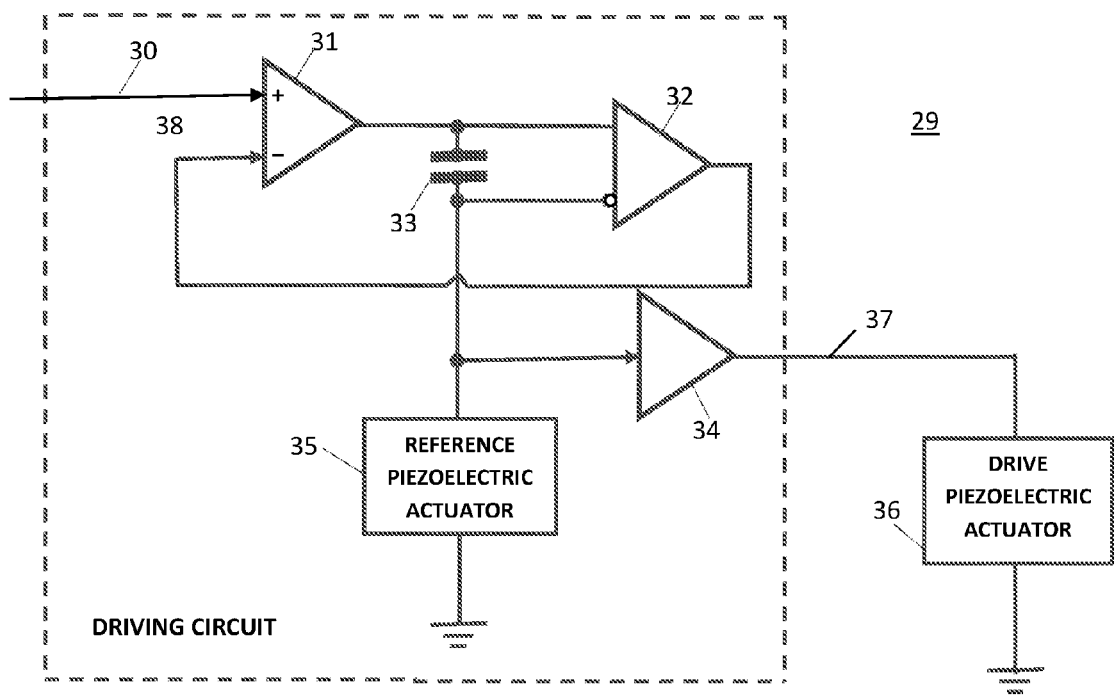
FIG. 3 shows a driving circuit for a piezoelectric actuator according to the present invention.
Figure 3A:
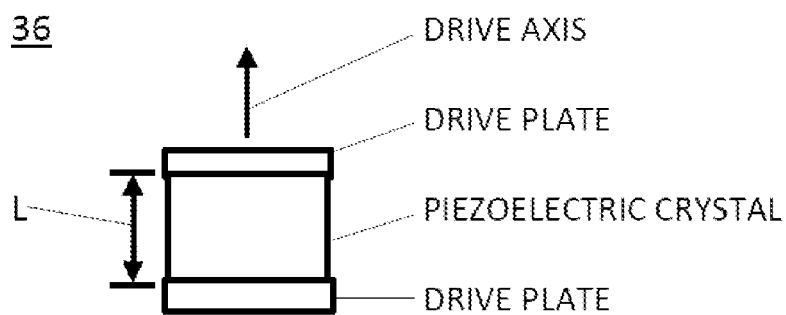
FIG. 3A shows an exemplary form of the drive piezoelectric actuator of FIG. 3.
Figure 3B:
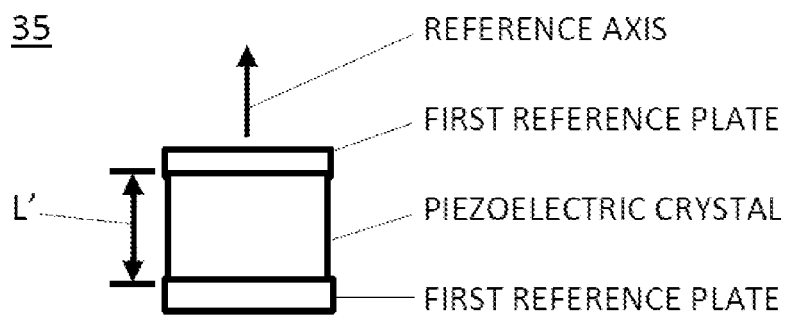
FIG. 3B shows an exemplary form of the reference piezoelectric actuator of FIG. 3.

A block diagram of a driving circuit 29 for a piezoelectric actuator according to the present invention, is shown in FIG. 3, FIG. 3A and FIG. 3B. As shown in FIG. 3, the block diagram of circuit 29 contains an operative (or "drive") piezoelectric actuator 36 (FIG. 3A), configured to be driven in response to a control signal applied via input terminal 30 to the driving circuit 29. By way of example, the drive piezoelectric actuator 36 includes a piezoelectric crystal (i) extending along a drive axis, a distance L between a first electrically conductive drive plate transverse to the drive axis and a second electrically conductive drive plate transverse to the drive axis, and (ii) characterized by a set of dimensional and electro-mechanical drive properties, whereby the distance L is a function of the magnitude and polarity of a voltage applied across the first drive plate and a second drive plate, wherein the second drive plate is connected to a first reference potential, for example, ground potential. The control signal effects mechanical deformation of the piezoelectric crystal of the operative piezoelectric actuator 36, which is responsible for displacements of a write/read head coupled thereto. The driving circuit includes a reference piezoelectric actuator 35 (FIG. 3B), which also includes a piezoelectric crystal (i) extending along a reference axis, a distance L' between a first electrically conductive reference plate transverse to the reference axis and a second electrically conductive reference plate transverse to the reference axis, and (ii) characterized by a set of dimensional and electro-mechanical reference properties, whereby the distance L' is a function of the magnitude and polarity of a voltage applied across the first reference plate and second reference plate, wherein the first reference plate is connected to the inverting input terminal of the first amplifier, and wherein the second reference plate is connected to a second reference potential. The electro-mechanical characteristics of the reference piezoelectric actuator 35 are the same as the electro-mechanical characteristics of the drive piezoelectric actuator 36, although slight variations might be present so they are only substantially the same, for example in the range +/−10%. In particular, the functional relationship of L' with voltage is substantially the same as the functional relationship of L with voltage for the drive piezoelectric actuator 36.

The reference piezoelectric actuator 35 is used to create a voltage for controlling the operative piezoelectric actuator 36. In the form illustrated in FIG. 3, the driving circuit further includes a fixed value capacitor 33 and three amplifiers: input (primary) operational amplifier 31, differential amplifier 32, and a unity gain buffer amplifier 34. There are a first reference potential and the second reference potential in the driving circuit. In a preferred form, the first reference potential and the second reference potential are the same, and are a ground potential. In a form, to enhance the likelihood that the electro-mechanical characteristics of the reference piezoelectric actuator 35 are substantially the same as those of the operative piezoelectric actuator 36, an entire head gimbal assembly (HGA) including a piezoelectric actuator 35, a write/read head and other associated HGA components, may be placed in the driving circuit (with this head gimbal assembly being of the same kind as the HGA used on the associated disk of the disk drive).

The operational, or "primary" amplifier 31, the differential amplifier 32, and connections between them, form a feedback loop. In operation, transient processes in the loop bring the voltage at the output of differential amplifier 32 into coincidence with the input signal at the terminal 30. The transfer function between the input of the differential amplifier 32 and the inverting input terminal 38 of the primary amplifier 31, is made equal to 1, so that the settled value of voltage across capacitor 33 is the same as an input voltage at input terminal 30. With this configuration, current that is produced by primary operational amplifier 31 flows through capacitor 33 and reference piezoelectric actuator 35, and creates in them, equal valued electric charges. The voltage established at the junction of capacitor 33 and reference piezoelectric actuator 35, is passed via unity gain buffer amplifier 34 and applied via a single wire 37 across ground-connected operative piezoelectric actuator 36. As a result, the charge stored in the reference piezoelectric actuator 35 equals the charge stored in capacitor 33, which is proportional to the voltage at the junction of capacitor 33 and reference piezoelectric actuator 35. Since the voltage between terminals of the capacitor 33 equals the voltage of the input signal 30, the charge stored in the reference piezoelectric actuator 35 is proportional to the input signal.

In summary, since the buffer amplifier 34 has a unity gain, the voltage at its output equals the voltage at the input. The output of the buffer amplifier 34 is connected via single wire 37 to the operative piezoelectric actuator 36. Therefore the voltage at the drive piezoelectric actuator 36 equals the voltage at the reference piezoelectric actuator 35 and the charge stored in the operative piezoelectric actuator 36 equals the charge in the reference piezoelectric actuator 35. Hence the charge stored in the drive piezoelectric actuator 36 turns out to be proportional to the input signal 30.

In practice, the drive circuit 29 may include piezoelectric actuator 36, as shown in FIG. 3, or, alternatively, may include only the illustrated elements within driving circuit, which are adapted to be used with an external equivalent to piezoelectric actuator 36. In use, in the driving circuit of a hard disk drive or of head and/or disk test equipment, a digital-to-analog converter (DAC) typically produces a control signal that specifies desired displacements of the write/read head. That control signal is applied to the input terminal 30 of driving circuit 29. The fact that the electric charge transferred to the operative piezoelectric actuator 36 is proportional to the input signal with a fixed proportional factor, suppresses the hysteresis effect and effects control of the deformation of the actuator 36, and the resultant displacement transmitted to the write/read head with the necessary accuracy.

The output impedance of the buffer amplifier 34 is small so that the circuit of driving circuit that connects operative piezoelectric actuator 36 to the driving circuit located in the driving circuit, appears to be practically free from induced noise. As a consequence, a significant cause of decrease in the accuracy of write/read head positioning provided by prior art drive circuits, is eliminated. In the form of the block diagram of the configuration of FIG. 3, only one wire, wire 37, is needed to connect a first (or drive) terminal of the drive piezoelectric actuator 36 to the driving circuit, wherein the second terminal of the actuator terminals, is connected to ground potential. As a consequence, driving circuit of a piezoelectric actuator according the present technology, exemplified but not limited to the illustrated circuit 29, fully complies with the requirements imposed on it in hard disk drives.

The driving circuit for a piezoelectric actuator according to the present technology may be used not only in disk storage devices and in head/disk test equipment, but also in other applications where (i) high accuracy control is required, and (ii) only one wire between the driving circuit and a first plate of a piezoelectric actuator is available, and a second plate of the piezoelectric actuator is grounded.

Figure 4:
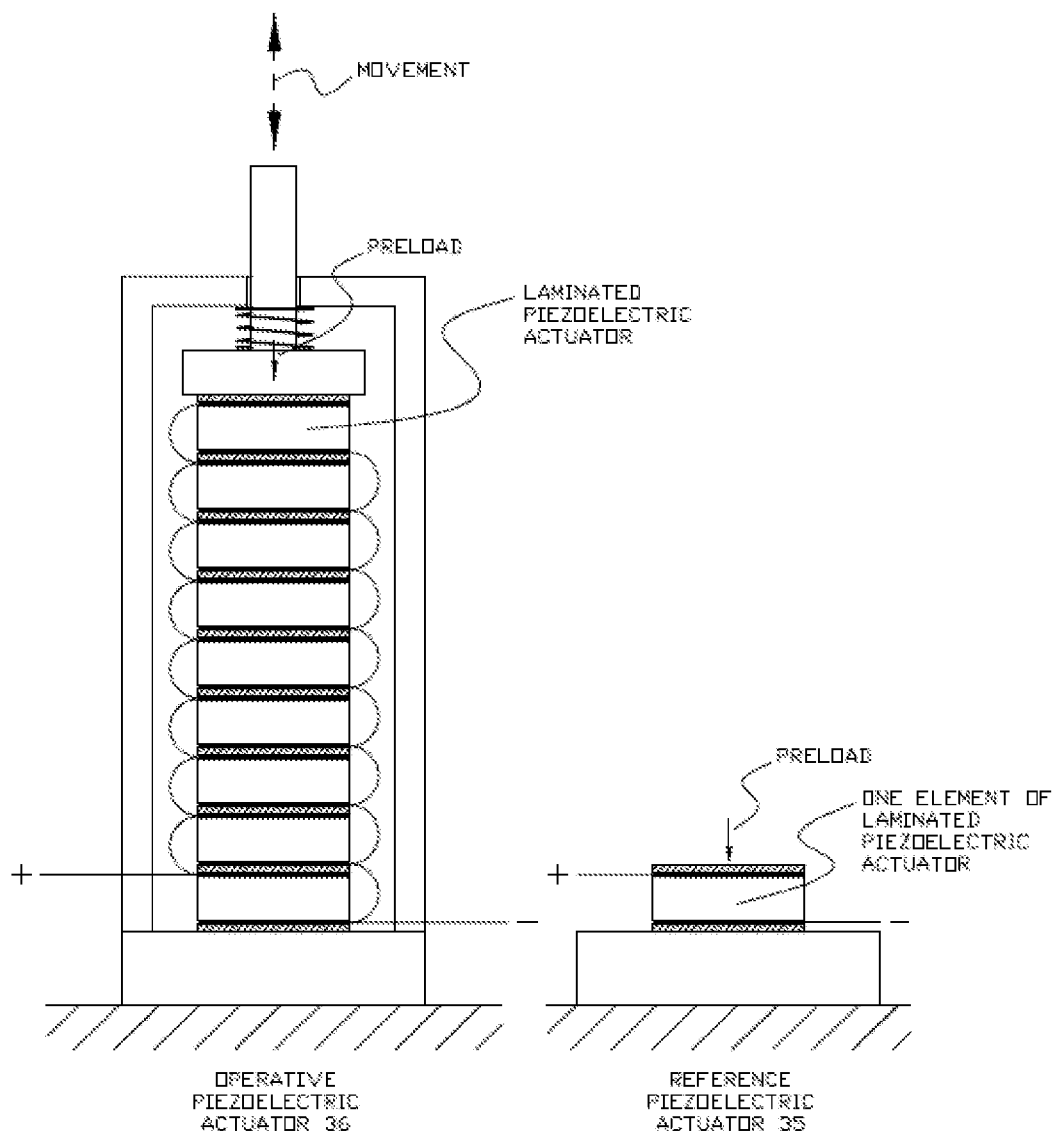
FIG. 4 shows a stacked multiple piezoelectric actuator assembly of an exemplary form of a driving circuit according to the present technology.

In order to control relatively large displacements, for example, of a magnetic head in a head gimbal assembly (HGA) of a disk drive, laminated piezoelectric actuators are used. A laminated piezoelectric actuator comprises a plurality of identical electrostrictive elements (see for example U.S. Pat. No. 5,208,506, entitled "Laminated piezoelectric actuator" and U.S. Pat. No. 4,460,842, entitled "Piezoelectric Device with Constant Preload Force"). The corresponding structure of an actuator is shown in FIG. 4 herein. The electrostrictive elements of FIG. 4 are mechanically connected one after another, so that total displacement produced by the actuator equals a sum of partial displacement of the individual electrostrictive elements. Electrically, the electrostrictive elements are connected in parallel, so that the voltage on different elements is the same and equals the voltage applied to the piezoelectric actuator. The resulting current that flows through the laminated piezoelectric actuator equals a sum of currents flowing through each of the electrostrictive elements. The driving circuit (not shown in FIG. 4, but can correspond to that shown in FIG. 3) according to the present technology, in that case may use a reference piezoelectric actuator (of the type shown in FIG. 4) corresponding to reference piezoelectric actuator 35 in FIG. 3, that consists of a single electrostrictive element of the same type as the individual electrostrictive elements of the laminated drive piezoelectric actuator. At the same time, a buffer amplifier corresponding to buffer amplifier 34 in FIG. 3, produces a current equal to the current flowing through reference piezoelectric actuator 35 multiplied by the number of elements in the drive piezoelectric actuator 36. Otherwise, in this example, the driving circuit remains the same as in the foregoing description.

To improve the accuracy of actuator operation, the drive piezoelectric actuator 36 is often preloaded by a mechanical force, e.g., with a spring, as shown in FIG. 4. If that is the case, to achieve identity of the reference piezoelectric actuator 35 with the drive piezoelectric actuator 36, the reference piezoelectric actuator 35 is preloaded by an equal preload force, indicated by the down-pointing arrow in FIG. 4, for simplicity.

Although the foregoing description of the embodiment of the present technology contains some details for purposes of clarity of understanding, the technology is not limited to the detail provided. There are many alternative ways of implementing the technology. The disclosed embodiment is illustrative and not restrictive.

The invention claimed is:

1. A driving circuit for controlling a drive piezoelectric actuator, wherein the drive piezoelectric actuator includes a piezoelectric crystal:
   i. extending along a drive axis a distance L between a first electrically conductive drive plate transverse to the drive axis and a second electrically conductive drive plate transverse to the drive axis, and
   ii. characterized by a set of dimensional and electromechanical drive properties, whereby the distance L is a function of the magnitude and polarity of a voltage applied across the first drive plate and second drive plate,
   wherein the second drive plate is connected to a first reference potential,
   comprising:
   A. a differential amplifier having a non-inverting input terminal, an inverting input terminal, and an output terminal providing a feedback signal representative of voltage difference across the non-inverting input terminal and the inverting input terminal of the differential amplifier;
   B. a capacitor connected across the non-inverting input terminal and the inverting input terminal of the differential amplifier,
   C. a reference piezoelectric actuator including a piezoelectric crystal:
      i. extending along a reference axis a distance L' between a first electrically conductive reference plate transverse to the reference axis and a second electrically conductive reference plate transverse to the reference axis, and
      ii. characterized by a set of dimensional and electromechanical reference properties, whereby the distance L' is a function of the magnitude and polarity of a voltage applied across the first reference plate and second reference plate, and wherein the functional relationship of L' with voltage is substantially the same as the functional relationship of L with voltage for the drive piezoelectric actuator,
      wherein the first reference plate is connected to the inverting input terminal of the differential amplifier, and
      wherein the second reference plate is connected to a second reference potential,
   D. an operational amplifier having a non-inverting input terminal for receiving an applied control signal, an inverting input terminal connected to the output terminal of the differential amplifier for receiving the feedback signal, and an output terminal connected to the non-inverting input terminal of the differential amplifier,
   E. a buffer amplifier having a non-inverting input terminal connected to the first reference plate of the reference piezoelectric actuator, and an output terminal for connecting to the first drive plate of the drive piezoelectric actuator, wherein the buffer amplifier is characterized by unity gain.

2. A driving circuit according to claim 1 wherein the first reference potential and the second reference potential are the same potential.

3. A driving circuit according to claim 1 wherein the first reference potential and the second reference potential are ground potential.

4. A driving circuit according to claim 1, further comprising a preload force assembly for applying a predetermined preload force to the first reference plate in the direction of the reference axis and toward the second reference plate.

5. A driving circuit for controlling a drive piezoelectric actuator assembly, comprising:
   A. a drive piezoelectric actuator including a piezoelectric crystal:
      i. extending along a drive axis a distance L between a first electrically conductive drive plate transverse to the drive axis and a second electrically conductive drive plate transverse to the drive axis, and
      ii. characterized by a set of dimensional and electromechanical drive properties, whereby the distance L is a function of the magnitude and polarity of a voltage applied across the first drive plate and second drive plate,
      wherein the second drive plate is connected to a first reference potential,
   B. a differential amplifier having a non-inverting input terminal, an inverting input terminal, and an output terminal providing a feedback signal representative of voltage difference across the non-inverting input terminal and the inverting input terminal of the differential amplifier,
   C. a capacitor connected across the non-inverting input terminal and the inverting input terminal of the differential amplifier,
   D. a reference piezoelectric actuator including a piezoelectric crystal:
      i. extending along a reference axis a distance L' between a first electrically conductive reference plate transverse to the reference axis and a second electrically conductive reference plate transverse to the reference axis, and ii. characterized by a set of dimensional and electro-mechanical reference properties, whereby the distance L' is a function of the magnitude and polarity of a voltage applied across the first reference plate and second reference plate, and wherein the functional relationship of L' with voltage is substantially the same as the functional relationship of L with voltage for the drive piezoelectric actuator, wherein the first reference plate is connected to the inverting input terminal of the differential amplifier, and wherein the second reference plate is connected to a second reference potential, E. a differential amplifier having a non-inverting input terminal for receiving an applied control signal, an inverting input terminal connected to the output terminal of the differential amplifier for receiving a feedback signal, and an output terminal connected to the non-inverting input terminal of the differential amplifier, F. a buffer amplifier having a non-inverting input terminal connected to the first reference plate of the reference piezoelectric actuator, and an output terminal for connecting to the first drive plate of the drive piezoelectric actuator, wherein the buffer amplifier is characterized by unity gain.

6. A driving circuit according to claim 5 wherein the first reference potential and the second reference potential are the same potential.

7. A driving circuit according to claim 5 wherein the first reference potential and the second reference potential are ground potential.

8. A driving circuit according to claim 5, further comprising
i. a drive preload force assembly configured to apply a first predetermined preload force to the first drive plate in the direction of the drive axis and toward the second drive plate., and
ii. a reference preload force assembly configured to apply a second predetermined preload force to the first reference plate in the direction of the reference axis and toward the second reference plate,
wherein the first predetermined preload force and second predetermined preload force are equal in magnitude.

9. A driving circuit according to claim 5,
wherein the drive piezoelectric actuator comprises a laminated piezoelectric assembly including a plurality of similar laminated piezoelectric electrostrictive elements stacked along the drive axis, and
wherein the reference piezoelectric actuator includes a single electrostrictive element similar to the electrostrictive elements of the drive piezoelectric actuator, and
wherein the buffer amplifier is configured to create a voltage applied to the first drive plate that is equal to the voltage at the first reference plate of the reference piezoelectric actuator, and to produce a current to the drive piezoelectric actuator that is greater than the current flowing through the reference piezoelectric actuator by a factor corresponding to the number of electrostrictive elements in the drive piezoelectric actuator.

10. A driving circuit for controlling a drive piezoelectric actuator assembly, the driving circuit comprising:
a drive piezoelectric actuator including a drive terminal and a base terminal connected to ground, and characterized by dimensional and electro-mechanical properties
a reference piezoelectric actuator characterized by dimensional and electro-mechanical properties substantially matching the dimensional and electro-mechanical properties of the drive piezoelectric actuator;
a capacitor connected in series with the reference piezoelectric actuator;
an operational amplifier that receives at a non-inverting input terminal, a control signal, and includes an output terminal that feeds a current proportional to the input signal, into the in series connected capacitor and the reference piezoelectric actuator;
a differential amplifier with inputs connected to the capacitor, and an output, said differential amplifier repeating at its output, voltage applied to its input;
a connection between the output of the differential amplifier and the inverting terminal of the operational amplifier, wherein the connection closes a feedback loop that includes the operational amplifier and the differential amplifier, said feedback loop being configured to maintain the voltage at the capacitor equal to the input control signal; and
a buffer amplifier with an unity gain, and having an input connected to the reference piezoelectric actuator, and an output connected to a drive terminal of the drive piezoelectric actuator.

11. A driving circuit according to claim 10 wherein the reference piezoelectric actuator is preloaded by a reference mechanical force, and the drive piezoelectric actuator is preloaded by a drive mechanical force.

12. A driving circuit according to claim 11 wherein the reference mechanical force is equal to the drive mechanical force.

13. A driving circuit according to claim 10,
wherein the drive piezoelectric actuator comprises a laminated piezoelectric assembly including a plurality of similar electrostrictive elements stacked along the drive axis,
wherein the reference piezoelectric actuator includes a single electrostrictive element analogous to the electrostrictive elements of the drive piezoelectric actuator, and
wherein the buffer amplifier is configured to create a voltage applied to the first drive plate that is equal to the voltage at the first reference plate of the reference piezoelectric actuator, and to produce a current to the drive piezoelectric actuator that is greater than the current flowing through the reference piezoelectric actuator by a factor corresponding to the number of electrostrictive elements in the drive piezoelectric actuator.

* * * * *